United States Patent [19]
Ohsawa

[11] Patent Number: 5,220,527
[45] Date of Patent: Jun. 15, 1993

[54] DYNAMIC TYPE SEMICONDUCTOR MEMORY DEVICE

[75] Inventor: Takashi Ohsawa, Yokohama, Japan

[73] Assignee: Kabushiki Kaisha Toshiba, Kawasaki, Japan

[21] Appl. No.: 677,458

[22] Filed: Mar. 29, 1991

[30] Foreign Application Priority Data

Mar. 30, 1990 [JP] Japan .................................. 2-84681

[51] Int. Cl.⁵ ............................................. G11C 11/24
[52] U.S. Cl. ..................................... 365/149; 365/207; 365/208
[58] Field of Search ............... 365/149, 207, 208, 205, 365/189.04, 189.01

[56] References Cited

U.S. PATENT DOCUMENTS

| | | | |
|---|---|---|---|
| 4,748,596 | 5/1988 | Ogura et al. | 365/149 |
| 4,777,625 | 10/1988 | Sakui et al. | 365/207 |
| 4,780,850 | 10/1988 | Miyamoto et al. | 365/149 |
| 4,829,483 | 5/1989 | Ogihara | 365/205 |
| 4,984,206 | 1/1991 | Komatsu et al. | 365/149 |

OTHER PUBLICATIONS

ISSCC, Fumio Baba et al., Feb. 23, 1983, pp. 64-65.

*Primary Examiner*—Robert J. Pascal
*Assistant Examiner*—Tan Dinh
*Attorney, Agent, or Firm*—Banner, Birch, McKie & Beckett

[57] ABSTRACT

According to this invention, there is disclosed a dynamic type semiconductor memory device including a plurality of memory cells, plural pairs of bit lines, a first sense amplifier, arranged for each of the plural pairs of bit lines, for amplifying a bit line signal, a pair of data input/output lines for extracting data from the pair of bit lines, a second sense amplifier arranged for each of the plural pairs of bit lines and consisting of first and second driver MOS transistors the gates of which are connected to the first and second bit lines, the second sense amplifier being activated simultaneously when or immediately after the first sense amplifier is activated in a data reading operation, first and second column selecting transistors which are inserted between the pair of data input/output lines and the second sense amplifier and gates of which are connected to a column selecting line, and first and second write transistors each having one current path connected to a corresponding one of the pair of bit lines and the other current path connected to one or the other output terminal, the first and second write transistors being turned on in a data writing operation.

19 Claims, 15 Drawing Sheets

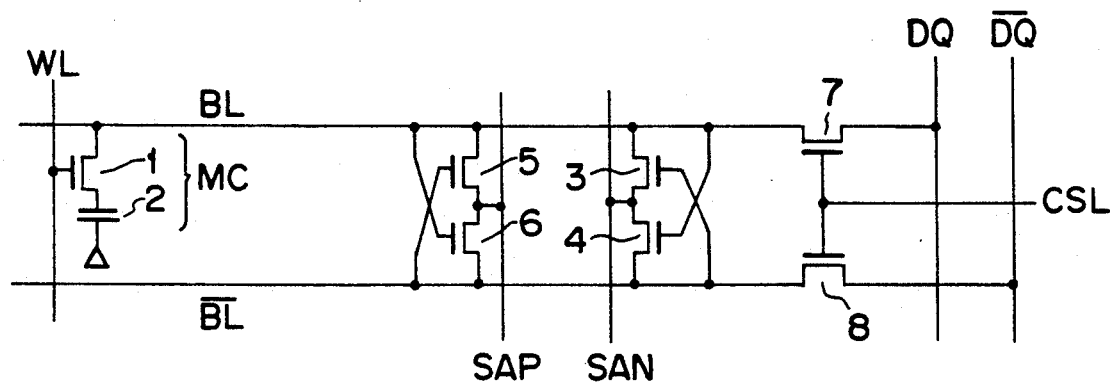
F I G. 1
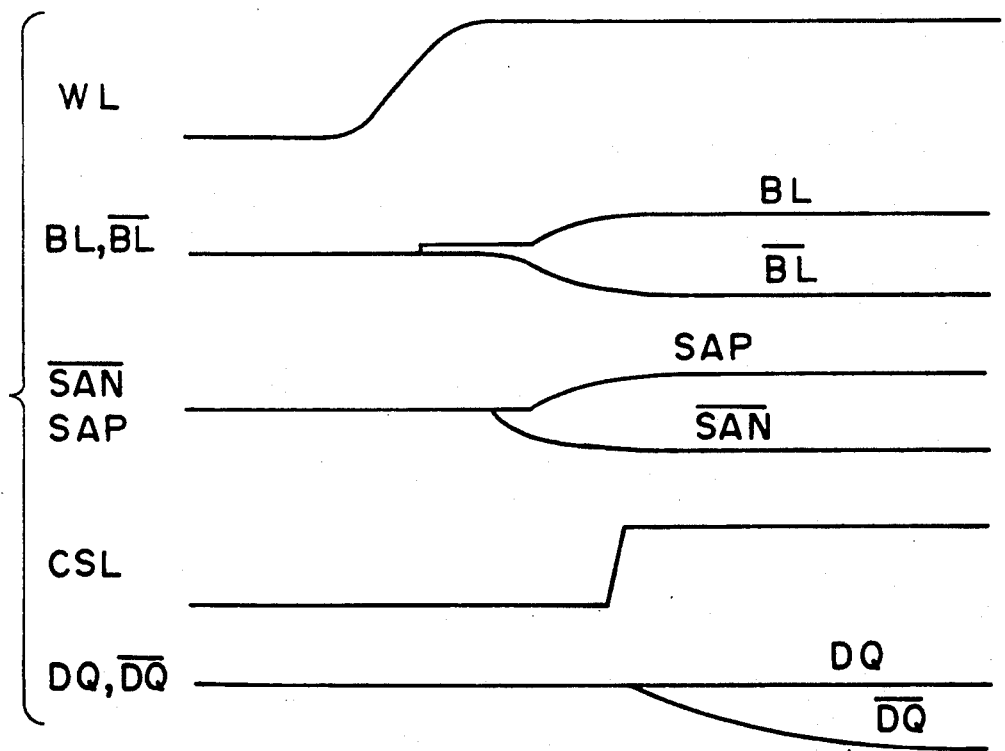
F I G. 2

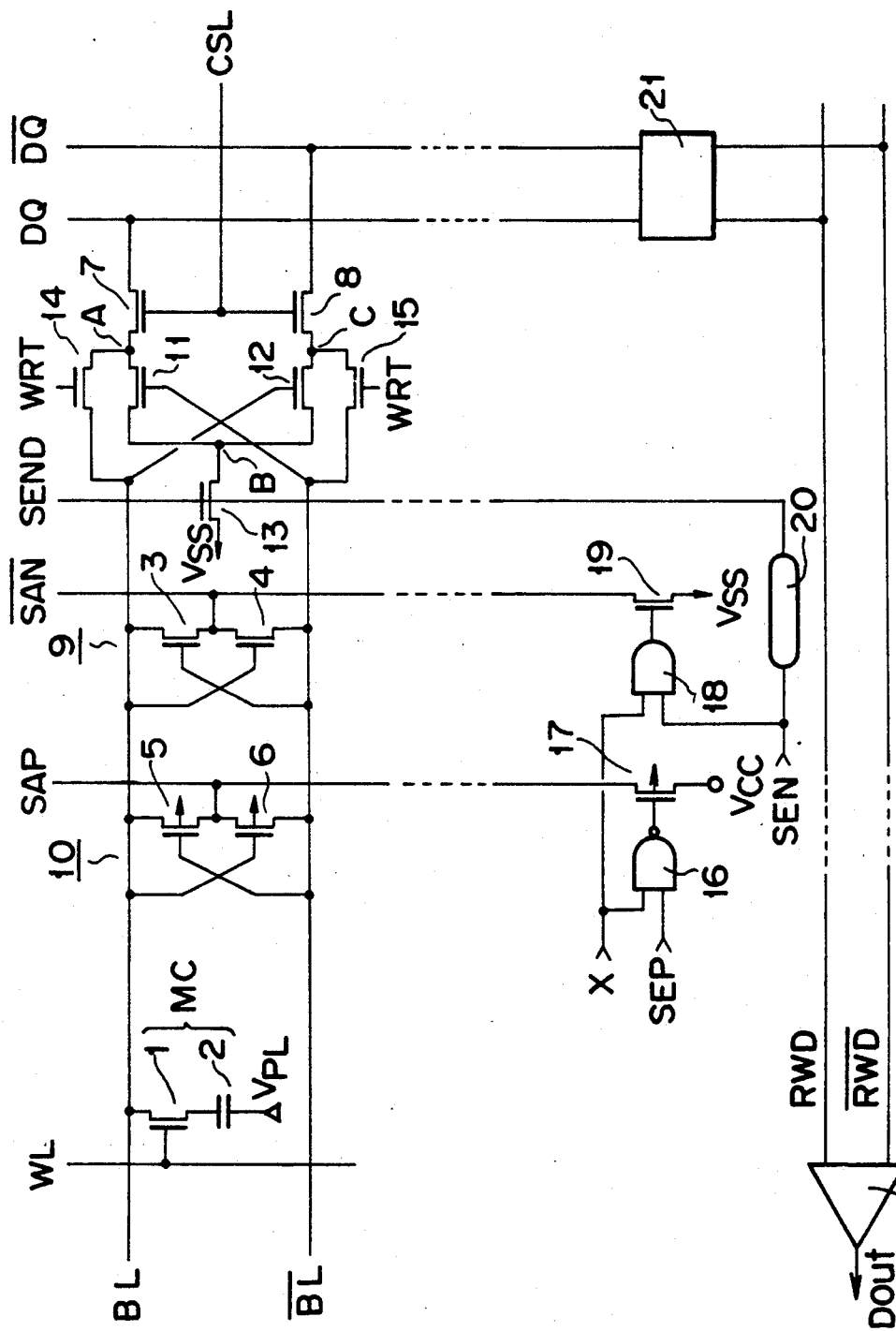
F I G. 3

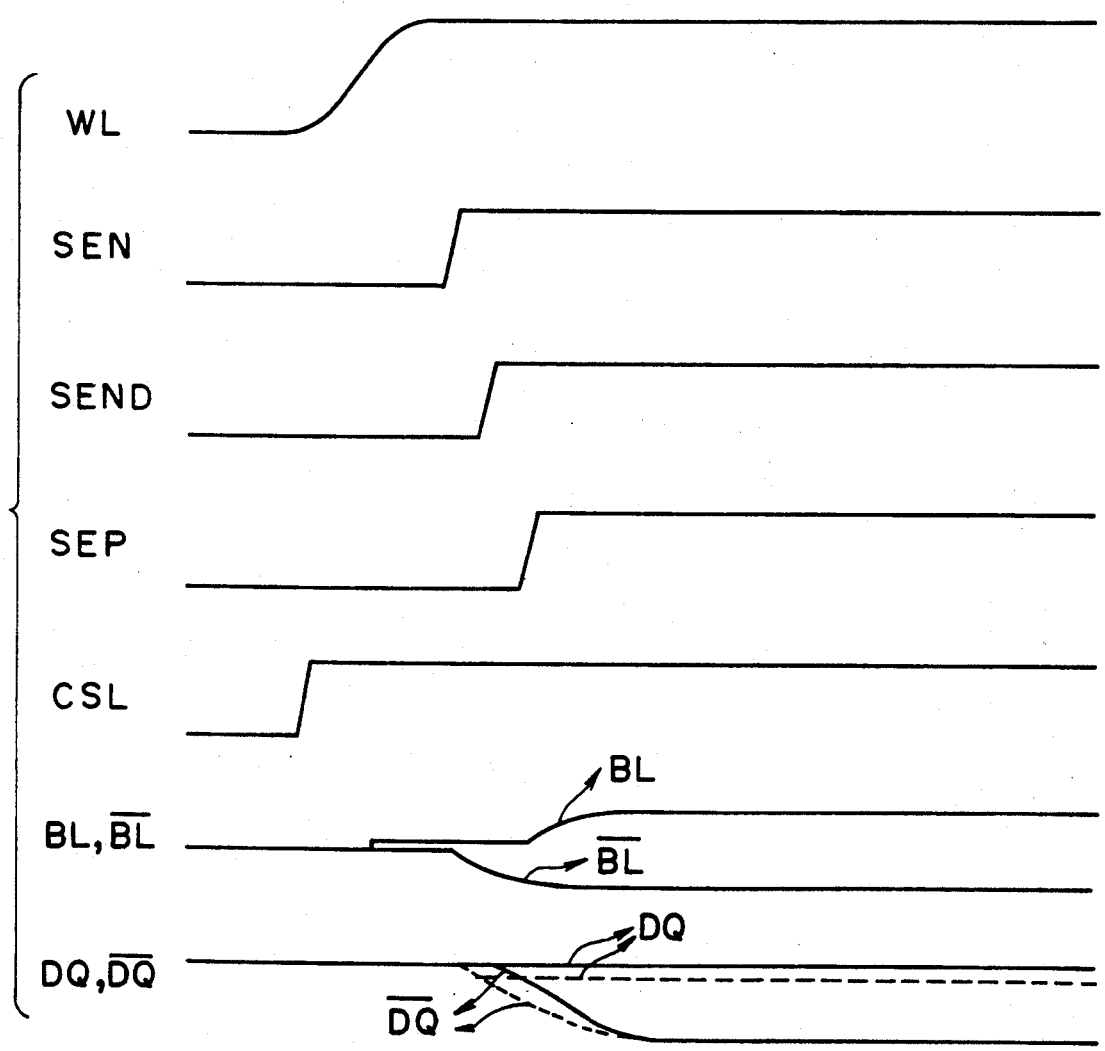
F I G. 4

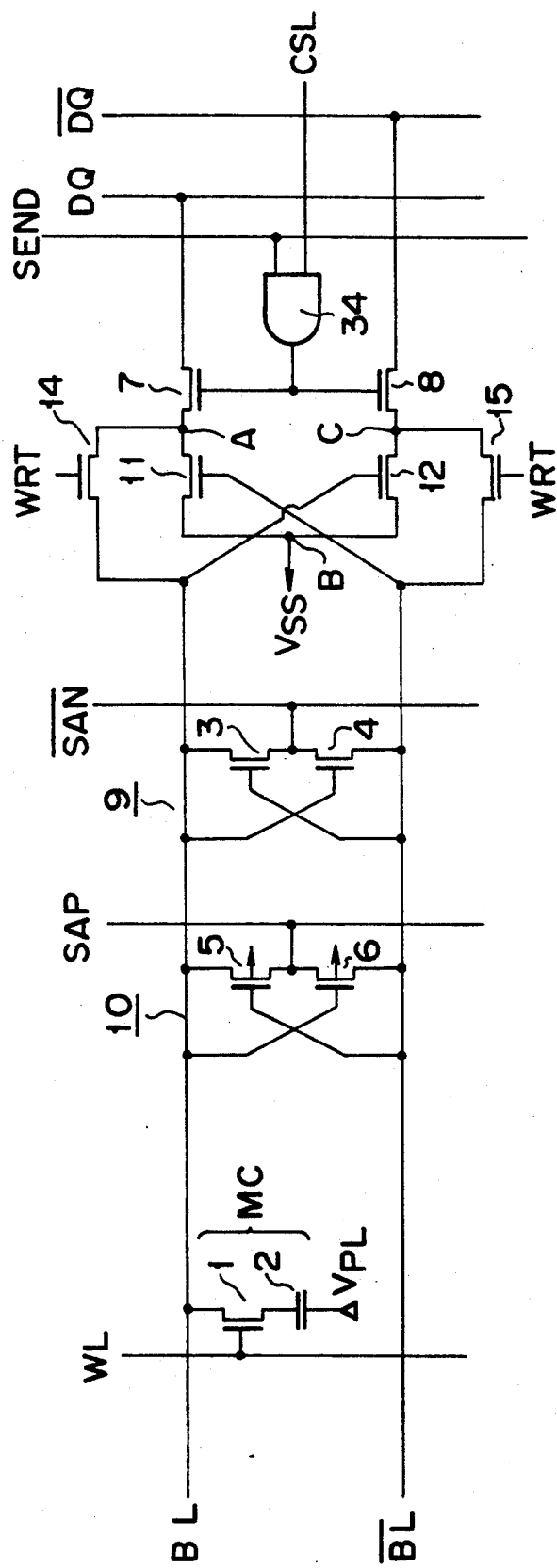
F I G. 9

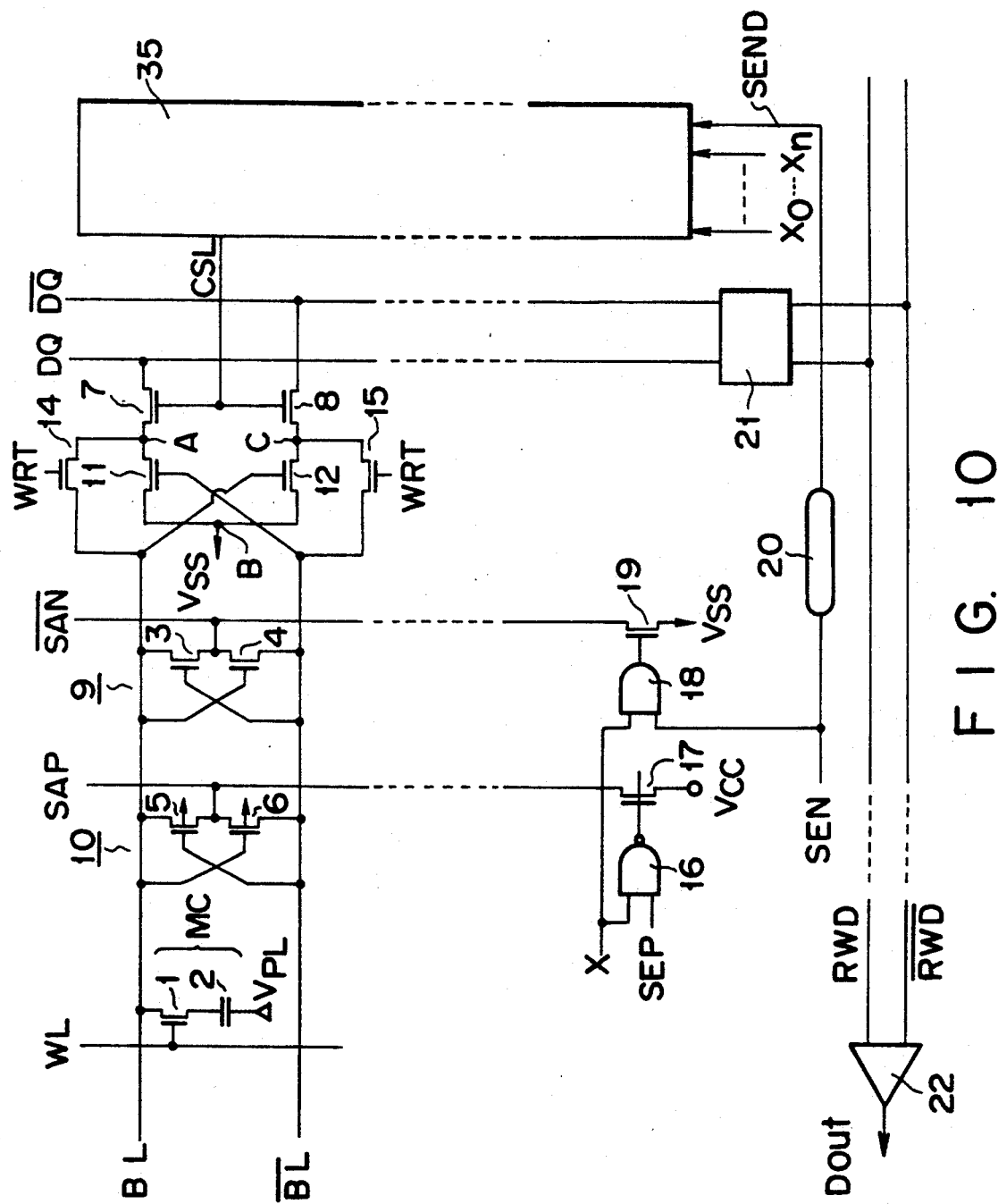
F I G. 10

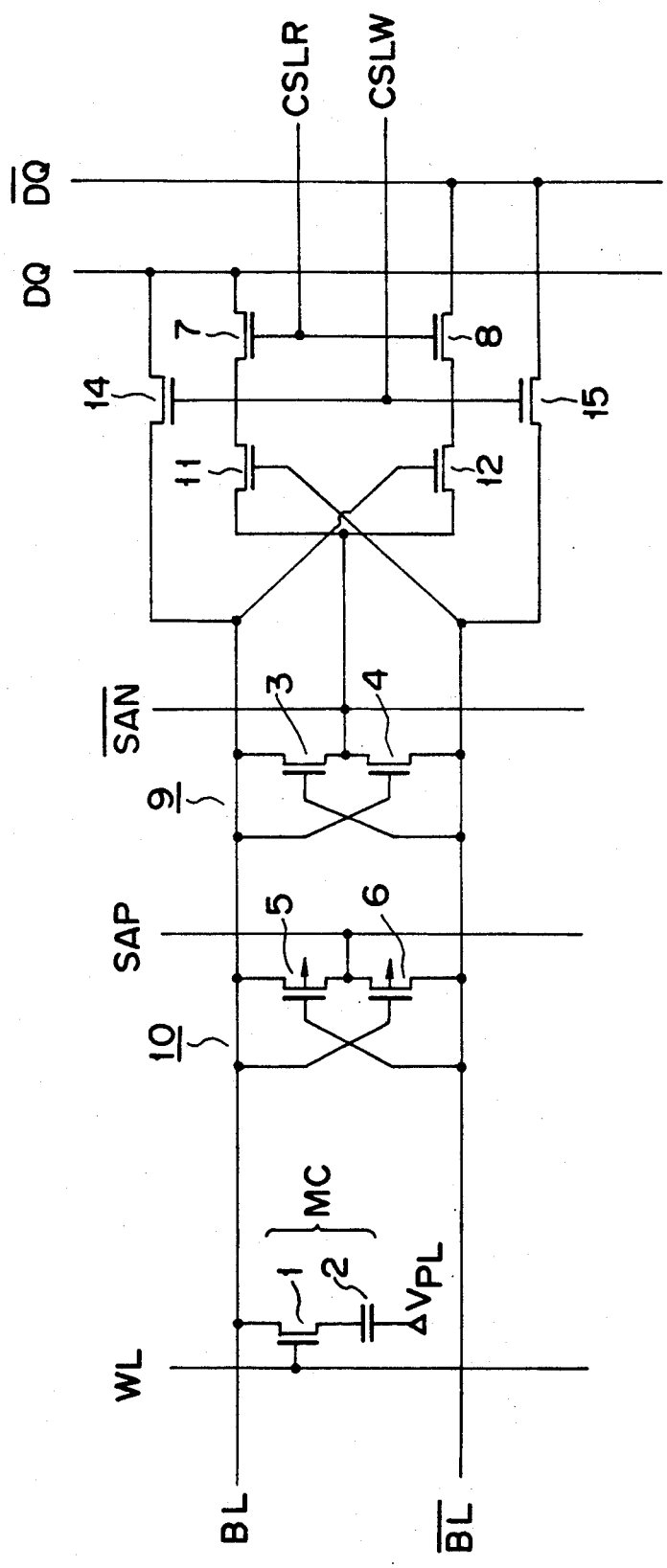
F I G. 16

DYNAMIC TYPE SEMICONDUCTOR MEMORY DEVICE

BACKGROUND OF THE INVENTION

1. Field of the Invention

The present invention relates to a dynamic type semiconductor memory device having a sense amplifier for amplifying a micro signal on a bit line and outputting it.

2. Description of the Related Art

A circuit arrangement of a sense amplifier section in a conventional dynamic type semiconductor memory device (to be referred to as a DRAM hereinafter) is shown in FIG. 116, and an operation waveform thereof is shown in FIG. 127.

That is, when a signal of a word line WL rises, a MOS transistor 1 in a memory cell MC is turned on, and a signal corresponding to data stored in a capacitor 2 is read out to the bit line BL, thereby generating a micro potential difference between a pair of bit lines BL and $\overline{BL}$. Thereafter, when a signal of a sense amplifier control line $\overline{SAN}$ for activating an n-channel side sense amplifier consisting of two n-channel MOS transistors 3 and 4 is disabled, a potential of the bit line ($\overline{BL}$ in FIG. 127) on a low-potential side is continuously decreased. Meanwhile, when a signal of a sense amplifier control line SAP for activating a p-channel side sense amplifier consisting of two p-channel MOS transistors 5 and 6 is raised, a potential of the bit line (BL in FIG. 127) on a high-potential side is continuously increased. When a potential difference between the bit lines BL and $\overline{BL}$ is sufficiently large, a signal of the column selecting line CSL is raised, and a pair of column selecting n-channel MOS transistors 7 and 8 are turned on. Thus, a bit line signal is generated from a pair of data input/output lines DQ and $\overline{DQ}$ which is precharged to a predetermined potential.

In the conventional DRAM, however, a signal of the pair of bit lines cannot be transmitted to a pair of data input/output lines at a high speed, because the column selecting line CSL cannot be raised unless a sense amplifier is activated to largely amplify the potential difference between the pair of bit lines. If the column selecting line CSL is raised when the potential difference between the pair of bit lines is small, charges precharged in the pair of data input/output lines flow into the pair of bit lines so that the potentials of the pair of bit lines float, and data may be broken due to unbalance of the potentials of the pair of bit lines. In addition, when an integration density of memory cells in a DRAM is increased, a time required for amplifying the potential difference between the pair of bit lines is further prolonged. Therefore, since a delay time of the sense amplifier section occupies a very large part in an access time, the delay time will be further increased in the future.

SUMMARY OF THE INVENTION

The present invention has been made in consideration of the above, and has as its object to provide a dynamic type semiconductor memory device in which signal transmission in a data read path from a bit line to a data input/output line is rarely delayed to realize a high-speed operation.

According to the present invention, there is provided a dynamic type semiconductor memory device comprising a plural pairs of bit lines for supplying data to a plurality of memory cells, a first sense amplifier arranged for each of the plural pairs of data input/output lines, for extracting data from the pairs of bit lines, a second sense amplifier arranged for each of the plural pairs of bit lines and consisting of first and second driver MOS transistors gates of which are connected to a pair of bit lines and a third activating MOS transistor rendered conductive simultaneously when or immediately after the first sense amplifier is activated, for amplifying signals of the pair of data input/output lines in a data reading operation, a pair of first and second column selecting transistors which are inserted between the pair of data input/output lines and the second sense amplifier and gates of which are connected to a column selecting line, a pair of write transistors which are inserted between the pair of data input/output lines and the pair of bit lines and are turned on in a data writing operation.

According to the present invention, in a dynamic type semiconductor memory device, in addition to the first sense amplifier for amplifying a bit line signal, the second sense amplifier for amplifying a signal from a pair of data input/output lines in a data reading operation is arranged, and a pair of bit lines are connected to the gates of the two driver MOS transistors constituting the second sense amplifier. Therefore, the signal from the pair of data input/output lines can be amplified without any influence on an amplification operation for the bit line signal in the first sense amplifier. Since the second sense amplifier is arranged, the amplification of the bit line signal and that of the data input/output line signal can be almost simultaneously started.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing a conventional DRAM;

FIG. 2 is a timing chart of the conventional DRAM in FIG. 1;

FIG. 3 is a circuit diagram showing an arrangement of a DRAM according to the first embodiment of the present invention;

FIG. 4 is a timing chart showing an operation of the DRAM in FIG. 1;

FIG. 9 is a circuit diagram showing an arrangement of a DRAM according to the sixth embodiment of the present invention;

FIG. 10 is a circuit diagram showing an arrangement of a DRAM according to the seventh embodiment of the present invention;

FIG. 16 is a circuit diagram showing an arrangement of a DRAM according to the twelfth embodiment of the present invention.

DETAILED DESCRIPTION OF THE PREFERRED EMBODIMENTS

Figure 5:
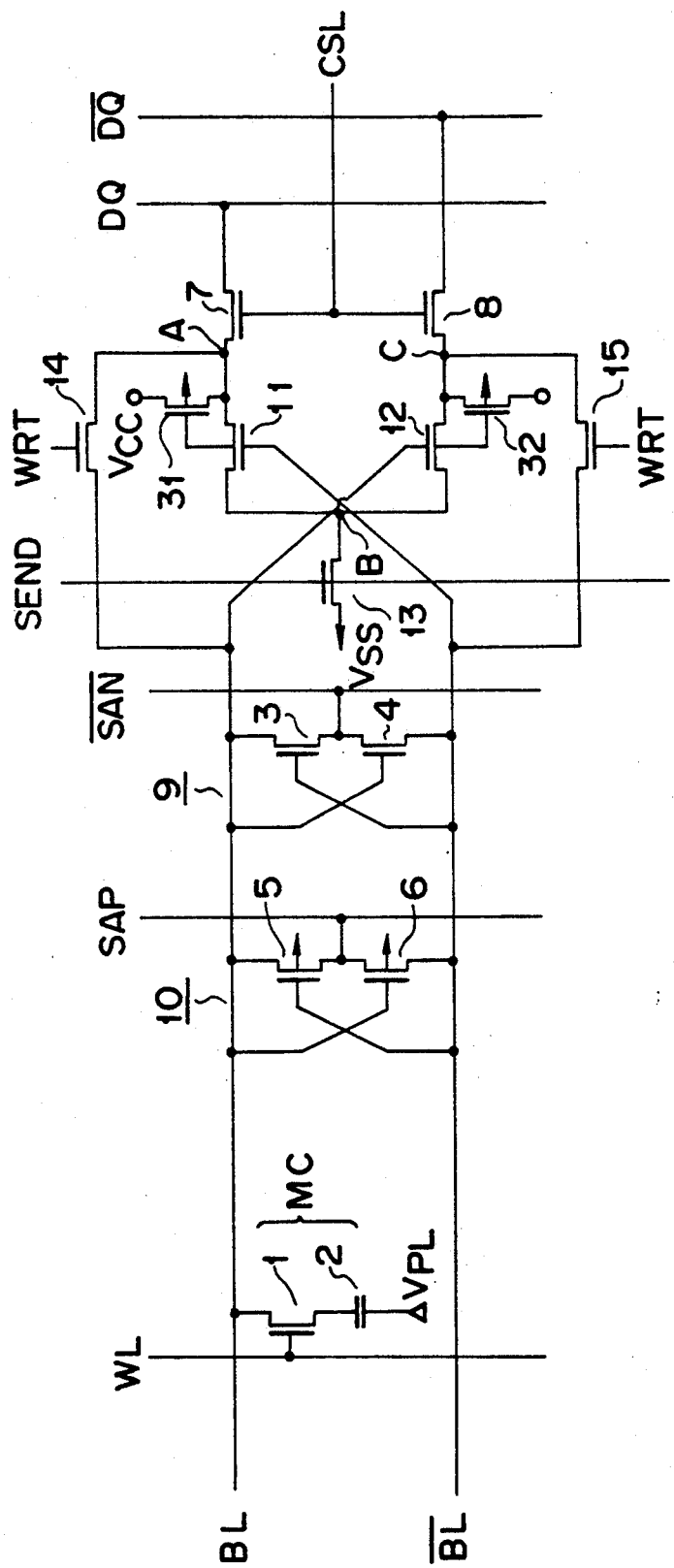
FIG. 5 is a circuit diagram showing an arrangement of a DRAM according to the second embodiment of the present invention.

Embodiments of the present invention will be described below with reference to the accompanying drawings.

FIG. 3 is a circuit diagram showing a DRAM according to the first embodiment of the present invention. A plurality of memory cells MC (only one is illustrated) are connected to a word line WL. As shown in FIG. 3, each of the memory cells consists of a selecting MOS transistor 1 and a data storage capacitor 2. The gate of the selecting MOS transistor 1 is connected to the word line WL, and a predetermined plate potential $V_{PL}$ is applied to one electrode (plate electrode) of the capacitor 2. One current path is connected to the other electrode of the capacitor 2, and the other current path opposite to one current path is connected to a corresponding bit line BL or $\overline{BL}$ (BL side in FIG. 3).

An n-channel side sense amplifier 9 consisting of two n-channel MOS transistors 3 and 4 and a p-channel side MOS transistor 10 consisting of two p-channel MOS transistors 5 and 6 are connected between the pair of bit lines BL and $\overline{BL}$. The drain and gate of the transistor 3 of the n-channel side sense amplifier 9 are connected to the bit lines BL and $\overline{BL}$, respectively, and the drain and gate of the transistor 4 are connected to the bit line $\overline{BL}$ and BL, respectively. In addition, the sources of the transistors 3 and 4 are connected to each other. That is, the transistors 3 and 4 are connected as a flip-flop, the common source of the transistors 3 and 4 is connected to a sense amplifier control line $\overline{SAN}$ for activating the sense amplifier 9.

The drain and gate of the transistor 5 of the p-channel side sense amplifier 10 are connected to the bit lines BL and e,ovs/BL/ , respectively, and the drain and gate of the transistor 6 are connected to the bit lines $\overline{BL}$ and BL, respectively. In addition, the sources of the transistors 5 and 6 are connected to each other. That is, the two transistors 5 and 6 are also connected as a flip-flop, and the common source of the transistors 5 and 6 is connected to a sense amplifier control line SAP for activating the sense amplifier 10. A bit line sense amplifier for amplifying a potential difference between the pair of bit lines consists of the n-channel side sense amplifier 9 and the p-channel side sense amplifier 10.

A column selecting n-channel MOS transistor 7 is connected between one data input/output line DQ and a node A, and an n-channel MOS transistor for amplifying data input/output line signal 11 is connected between the node A and a node B. In addition, a column selecting n-channel MOS transistor 8 is connected between the other input/output line $\overline{DQ}$ and a node C, and an n-channel MOS transistor for amplifying data input/output line signal is connected between the node C and the node B. An activating n-channel MOS transistor 13 is connected between the node B and a ground potential Vss. The gates of the column selecting transistors 7 and 8 are commonly connected to a column selecting line CSL, the gate of the transistor 11 is connected to the bit line $\overline{BL}$, and the gate of the transistor 12 is connected to the bit line BL. That is, a data input/output line sense amplifier for amplifying a potential difference between the pair of data input/output lines in accordance with the signals of the bit lines BL and $\overline{BL}$ consists of the transistors 11 and 12, and the transistors 11 and 12 are driver transistors. The MOS transistor 13 is used for controlling the data input/output sense amplifier to be activated, the gate of the transistor 13 is connected to an activation control line SEND.

A data write n-channel MOS transistor 14 is connected between the node A and the bit line BL, and a data write n-channel MOS transistor 15 is connected between the node C and the bit line $\overline{BL}$. The gates of the data write transistors 14 and 15 are connected to a data write control line WRT, and the transistors 14 and 15 are simultaneously ON/OFF-controlled in response to a signal from the signal line WRT.

On the other hand, an address signal X and a signal from a signal line SAP for determining a level of the sense amplifier control line SAP are supplied to a NAND gate 16. An output from the NAND gate 16 is applied to the gate of a p-channel MOS transistor 17 inserted between the sense amplifier control line SAP and the power source potential Vcc. The address signal X and a signal of a signal line SEN for determining a level of the sense amplifier control line $\overline{SAN}$ are supplied to an AND gate 18. An output from the AND gate 18 is applied to the gate of an n-channel MOS transistor 19 inserted between the sense amplifier control line $\overline{SAN}$ and the ground potential Vss. The signal of the signal line SEN is also supplied to a delay circuit 20. An output from the delay circuit 20 is applied to the activation control line SEND.

A data input/output buffer 21 is connected to the pair of data input/output lines DQ and $\overline{DQ}$, and data obtained from the pair of data input/output lines DQ and $\overline{DQ}$ is amplified by the data input/output buffer 21 and output to a pair of data read/write lines RWD and $\overline{RWD}$. An output from the output buffer 22 is supplied outside the circuit as readout data Dout.

An operation of the DRAM with the above arrangement in a data reading state will be described below with reference to a timing chart in FIG. 4. A signal from the word line WL rises. At the same time, a signal of the column selecting line CSL rises. When the signal of the word line WL rises, the MOS transistor 1 in the memory cell MC is turned on, and a signal according to data stored in the capacitor 2 is read out to the bit line BL side. At this time, a maximum of a signal potential appearing on the bit line BL is several hundreds mV, potentials of the bit lines BL and $\overline{BL}$ are precharged by a means (not shown) to, e.g., 0.5.Vcc which is ½ of the power source potential Vcc. Since a signal of the activation control line SEND is set at "L" level, the activating transistor 13 is set in an OFF state. Therefore, charges are not extracted from the data input/output lines DQ and $\overline{DQ}$, and the data input/output lines DQ and are held at the potential of Vcc which is a precharge level.

When the signal of the word line WL completely reaches "H" level (in general, a level obtained by bootstrapping the power source potential Vcc, e.g., 1.5.Vcc), a signal of the signal line SEN is raised to "H" level. At this time, only when the pair of bit lines are set in a selecting state and the address signal X is set at "H" level, the output from the AND gate 18 goes to "H" level, and the transistor 19 is turned on. In addition, a signal of the sense amplifier control line $\overline{SAN}$ for activating the n-channel side sense amplifier 9 goes from "H" level (0.5.Vcc) to "L" level (Vss). Therefore, the potential of a low-potential bit line (in this case, $\overline{BL}$) of the pair of bit lines is continuously dropped to the Vss side. At this time, a speed of decreasing the potential of the bit line $\overline{BL}$ is low because the number of memory cells connected to one word line is very large, for example, a word line has 1,024 memory cells in a 4-Mbit DRAM. Therefore, since the number of n-channel side sense amplifiers to be activated is equal to the number of memory cells, a large amount of charges must be extracted through the common signal line $\overline{SAN}$, and a speed of extracting the charges is low by an influence of a line resistance present on the signal line $\overline{SAN}$. This tendency will be more conspicuous, as an integration density of memory cells is expected to be increased, e.g., from a 16-Mbit DRAM to a 64-bit DRAM.

A signal of the activation control line SEND goes to "H" level with a predetermined delay time set by the delay circuit 20 from the leading edge of a signal of the signal line SEN, and the data input/output line sense amplifier is activated by turning on the transistor 13. At this time, a signal of the column selecting line CSL is set at "H" level, and both the column selecting transistors 7 and 8 are turned on. Therefore, charges are extracted from any one of the pair of data input/output lines DQ and $\overline{DQ}$ to the ground potential Vss through the transistors 7, 11, and 13 or the transistors 8, 12, and 13. In this case, since the potential of the bit line $\overline{BL}$ side is decreased, charges are extracted from the data input/output line $\overline{DQ}$. At this time, a time delayed by the delay circuit 20 need not be especially prolonged but only some potential difference need be obtained between the pair of bit lines. In addition, a disadvantageous operation such that the pair of data input/output lines are drawn to "L" level can be prevented.

A signal of the signal line SEP goes to "H" level. At this time, since the address signal X is set at "H" level, an output from the NAND gate 16 goes to "L" level, the transistor 17 is turned on, and a signal of the sense amplifier control line SAP for activating the p-channel side sense amplifier 10 is raised from 0.5.Vcc to Vcc. Therefore, "H"-level side potentials of the pair of bit lines are continuously amplified toward Vcc, and the amplifying operation for the pair of bit lines is completed. Amplification on the data input/output buffer 21 and transmission of a signal to the data read/write lines RWD and $\overline{RWD}$ may be synchronously performed at a timing when the pair of data input/output lines have some potential difference, or the amplification may be asynchronously performed by a current mirror amplifier or the like. Thereafter, signals of the data read/write lines RWD and $\overline{RWD}$ are amplified by the output buffer 21, and they are output as readout data Dout outside the chip.

As described above, in the embodiment, immediately after the bit line sense amplifier is activated, the data input/output line sense amplifier can be activated, and a signal of the pair of bit lines and a signal of the pair of data input/output lines can almost simultaneously amplified. Therefore, signal transmission from the pair of bit lines to the pair of data input/output lines through a data reading path is rarely delayed, and the data can be read out at a high speed.

In the above embodiment, although the signal of the signal line SEN is delayed by the delay circuit 20 and supplied to the activation control line SEND, the signal of the signal line SEN may be directly supplied to the activation control line SEND without arranging the delay circuit 20. The change in potential of the data input/output lines DQ and $\overline{DQ}$ indicated by a broken line in FIG. 4 illustrates a case wherein the delay circuit 20 is not arranged FIG. 5 is a circuit diagram showing an arrangement of a DRAM according to the second embodiment of the present invention.

The DRAM of this embodiment is arranged as follows. That is, a load p-channel MOS transistor 31 is inserted between the node A and the power source potential Vcc in the DRAM of the embodiment in FIG. 3, and the gate of the transistor 31 is commonly connected to the n-channel MOS transistor 11. In addition, a load p-channel MOS transistor 32 is inserted between the node C and the power source potential Vcc, and the gate of the transistor 32 is commonly connected to the n-channel MOS transistor 12.

In a DRAM according to this embodiment, although the number of elements is increased by an increase in the load p-channel MOS transistors 3 and 32 compared with that of the embodiment in FIG. 3, the amplification of the pair of data input/output lines is advantageously increased.

Figure 6:
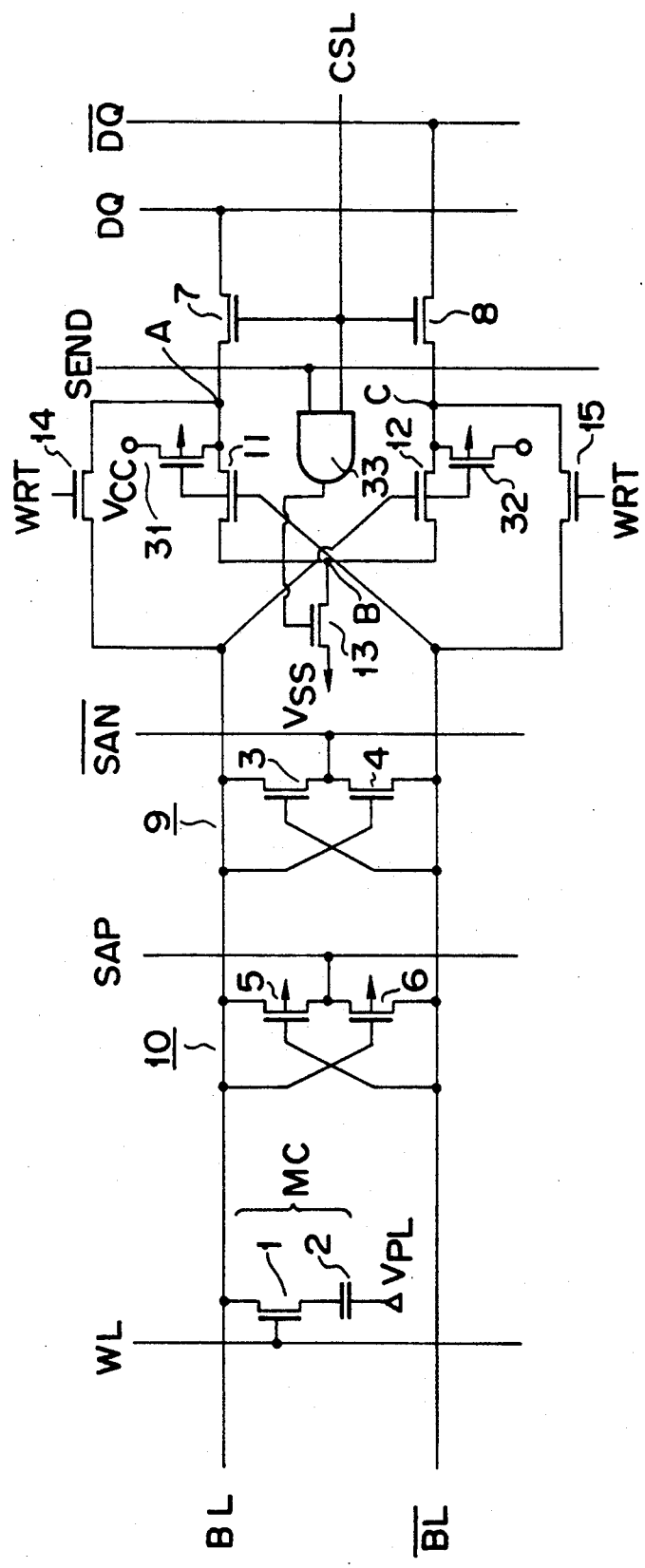
FIG. 6 is a circuit diagram showing an arrangement of the DRAM according to the third embodiment of the present invention.

FIG. 6 is a circuit diagram showing an arrangement of a DRAM according to the third embodiment of the present invention.

The activation control line SEN is connected to the gate of the transistor 13 such that the transistor 13 is controlled by only the signal of the signal line SEND in the embodiments in FIGS. 3 and 5. With this arrangement, a data input/output line sense amplifier of a non-selected column is operated so as to waste a power. Therefore, in the embodiment in FIG. 6, an AND gate 33 is arranged for every data input/output line sense amplifier, and signals of the column selecting line CSL and the activation control line SEND are input to the corresponding AND gate 33. Thus, the transistor 13 is ON/OFF-controlled by an output from the AND gate 33.

With this arrangement, since only a data input/output line sense amplifier of a selected column is operated, no through current flows from the power source potential Vcc to the ground potential Vss in a data input/output line sense amplifier of a non-selected column, and low power consumption can be achieved.

Figure 7:
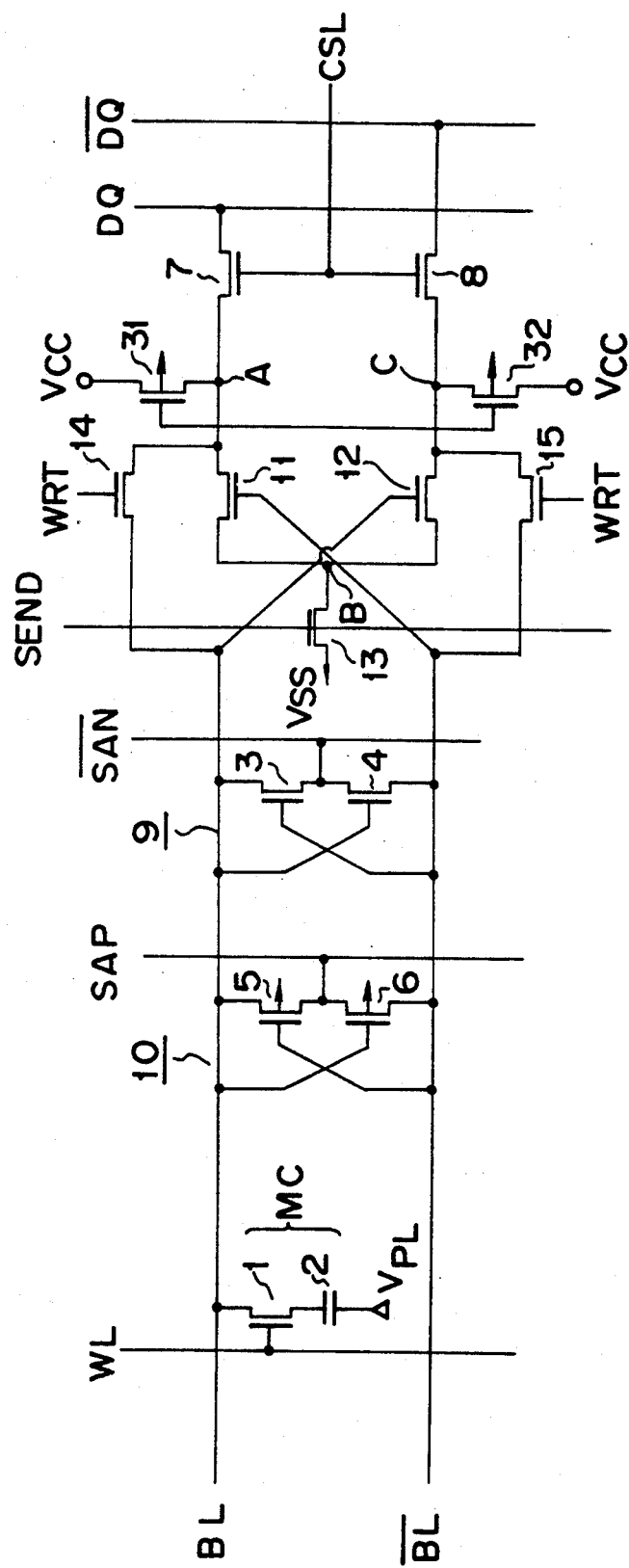
FIG. 7 is a circuit diagram showing an arrangement of a DRAM according to the fourth embodiment of the present invention.

FIG. 7 is a circuit diagram showing an arrangement of a DRAM according to the fourth embodiment of the present invention.

In the DRAM of this embodiment, unlike the embodiment in FIG. 5, the gates of the p-channel MOS transistors 31 and 32 are not commonly connected to the gates of the transistors 11 and 12, and the gates of the transistors 31 and 32 are commonly connected to the node C so as to add a p-channel current mirror load to the n-channel MOS transistors 11 and 12.

In the DRAM according to this embodiment, although the number of elements is increased by an increase in the load p-channel MOS transistors 31 and 32 compared with the embodiment in FIG. 3, the amplification of the pair of data input/output lines is advantageously increased.

Figure 8:
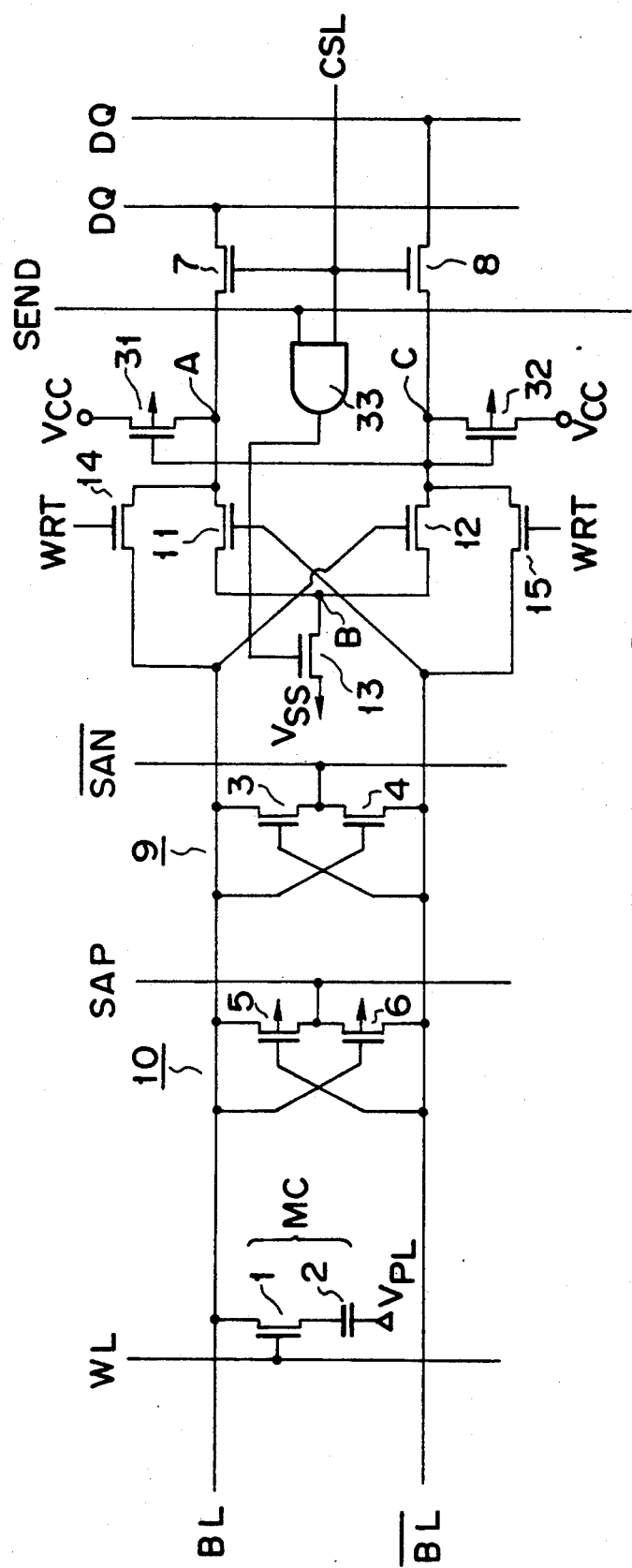
FIG. 8 is a circuit diagram showing an arrangement of a DRAM according to the fifth embodiment of the present invention.

FIG. 8 is a circuit diagram showing an arrangement of a DRAM according to the fifth embodiment of the present invention.

In the DRAM of this embodiment, in place of commonly connecting the gates of the p-channel MOS transistors 31 and 32 to the gates of the transistors 11 and 12 in the embodiment in FIG. 6, respectively, the gates of the transistors 31 and 32 are commonly connected to the node C so as to add a p-channel current mirror load to the n-channel MOS transistors 11 and 12.

FIG. 9 is a circuit diagram showing an arrangement of a DRAM according to the sixth embodiment of the present invention.

The DRAM of this embodiment is arranged as follows. That is, the activating n-channel MOS transistor 13 is removed from the data input/output line sense amplifier, the node B is connected to the ground potential Vss, and an AND gate 34 is arranged. In addition, signals of the corresponding column selecting line CSL and the corresponding activation control line SEND are input to the AND gate 34, and the pair of column selecting transistors 7 and 8 are ON/OFF-controlled by an output from the AND gate 34.

According to this embodiment, even when the signal of the column selecting line CSL is early raised, a timing of turning on the column selecting transistors 7 and 8 can be controlled by the signal of the activation control line SEND.

FIG. 10 is a circuit diagram showing an arrangement of a DRAM according to the seventh embodiment of the present invention.

Figure 11:
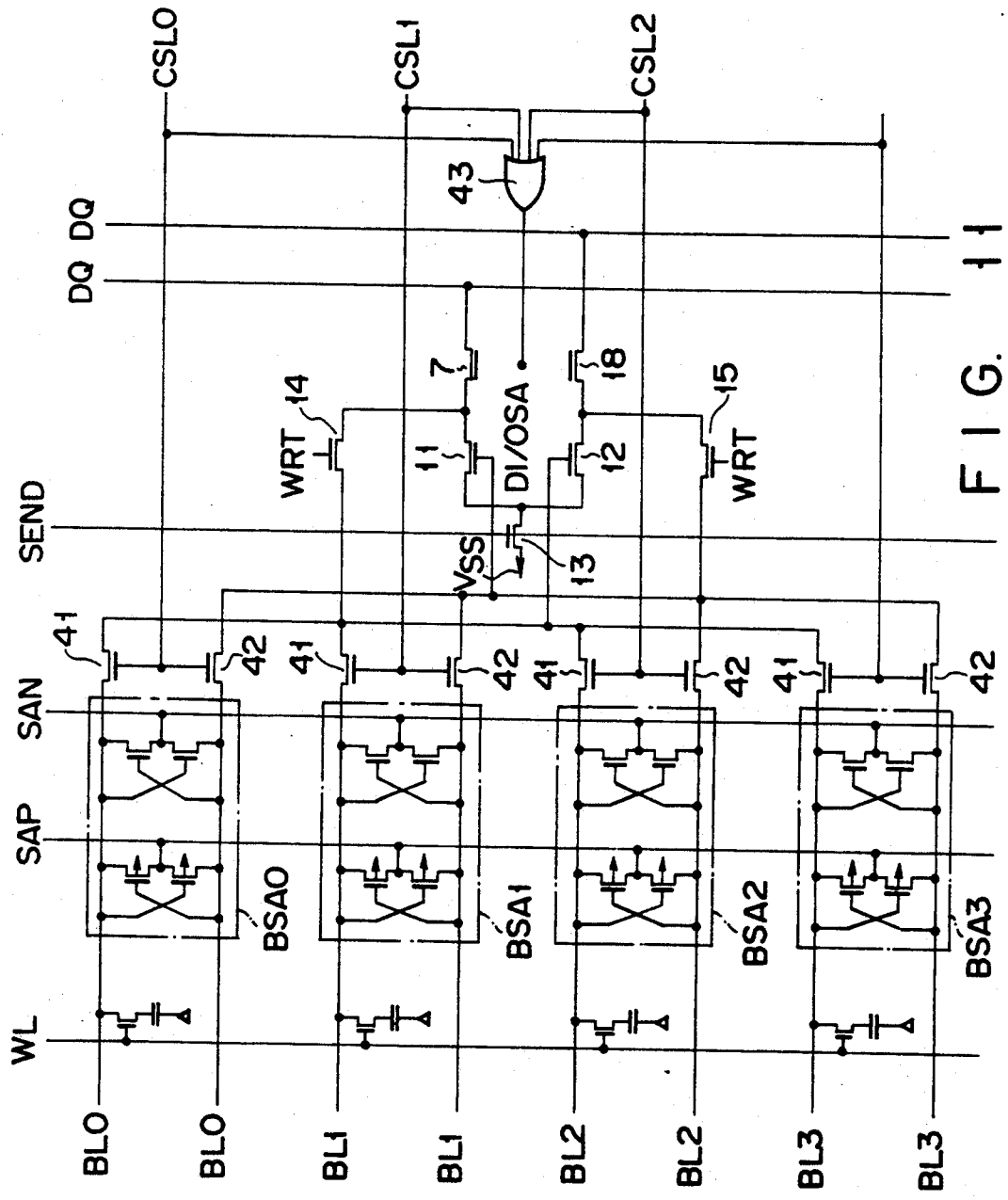
FIG. 11 is a circuit diagram showing an arrangement of a DRAM according to the eighth embodiment of the present invention.

In the DRAM of this embodiment, column address signals X0 to Xn and the signal of the activation control line SEND are input to a column decoder 35 for selectively driving the column selecting line CSL such that a signal having the same timing as that of the output from the AND gate 34 in the circuit of the embodiment in FIG. 11 is generated from the column decoder 35.

FIG. 11 is a circuit diagram showing an arrangement of a DRAM according to the eighth embodiment of the present invention.

In the DRAM of the embodiment in FIG. 3, although one data input/output sense amplifier is arranged for each pair of bit lines, one data input/output line sense amplifier may be arranged in units of plural pairs of bit lines. In the DRAM of the embodiment in FIG. 11, one data input/output line sense amplifier is arranged for every four pairs of bit lines. Referring to FIG. 11, each of four bit line sense amplifiers BSA0 to BSA3 consists of the n-channel side sense amplifier 9 and the p-channel side sense amplifier 10. As in the embodiment in FIG. 3, a data input/output line sense ampli-fier DI/OSA consists of the three n-channel MOS transis-tors 11, 12, and 13.

The four bit line sense amplifiers BSA0 to BSA3 are connected between a pair of bit lines BL0 and $\overline{BL0}$ to a pair of bit lines BL3 and $\overline{BL3}$ respectively, and activated by signals of the sense amplifier control lines SAN and SAP. In addition, the bit lines BL0 to BL3 are connected to the data input/output sense amplifier DI/OSA through the corresponding n-channel MOS transistors 41 on the BL side, respectively, and the bit lines $\overline{BL0}$ to $\overline{BL3}$ are connected to the data input/output sense amplifier DI/OSA through the corresponding n-channel MOS transistors 42 on the $\overline{BL}$ side, respectively. The gates of the transistors 41 and 42 are connected to each other for every pair of bit lines, and four column selecting lines CSL0 to CSL3 are connected to the common gates of the transistors 41 and 42, respectively. In addition, an output from an OR gate 43 receiving the signals from the four column selecting lines CSL0 to CSL3 is applied to the gates of the two column selecting n-channel MOS transistors 7 and 8 connected between the data input/output line sense amplifier DI/DSA and the pair of data input/output lines.

In the DRAM with the above arrangement, one of signals of the four column selecting lines CSL0 to CSL3 goes to "H" level, and one of four pairs of transistors 41 and 42 is turned on. When one of the four bit line sense amplifiers BSAO to BSA3 is selectively connected to the data input/output line sense amplifier DI/OSA, the output from the OR gate 43 goes to "H" level, and the column selecting n-channel MOS transistors 7 and 8 are turned on.

The DRAM of this embodiment is effectively used, for example, when the area of the data input/output line sense amplifiers on a silicon chip is too large to arrange a data input/output line sense amplifier for each pair of bit lines, or when a data input/output line sense amplifier is arranged for each pair of bit lines such that a chip area is increased exceeding an allowable range.

Figure 12:
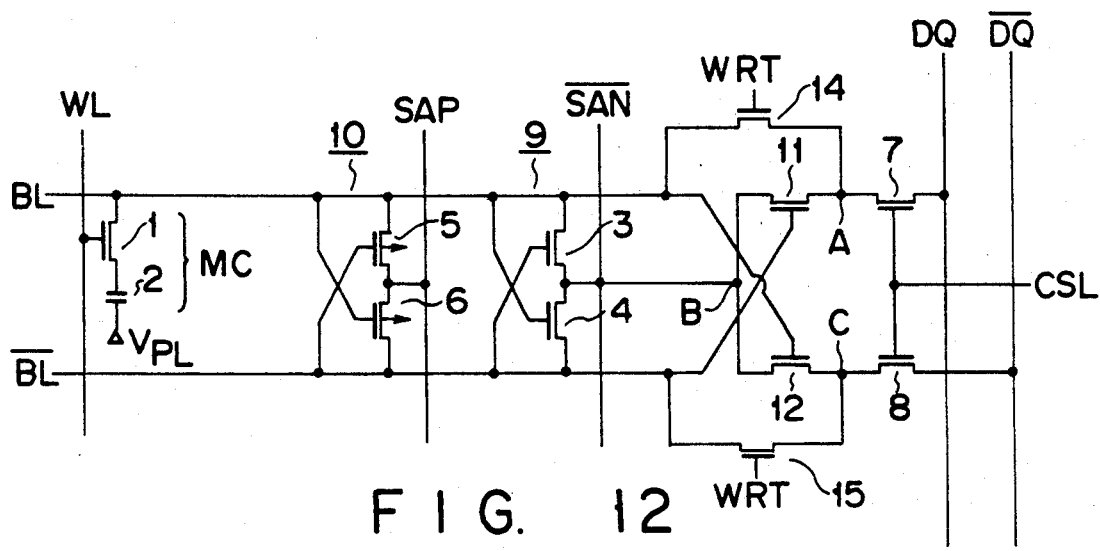
FIG. 12 is a circuit diagram showing an arrangement of a DRAM according to the ninth embodiment of the present invention.

FIG. 12 is a circuit diagram showing a arrangement of a DRAM according to the ninth embodiment of the present invention.

In the first to eighth embodiments, a timing of activating the data input/output line sense amplifier is defined by controlling a timing of driving the gate signals from the activating transistor 13 or the column selecting transistors 7 and 8. In contrast to this in this embodiment, the transistor 13 is removed, and the common node B of the transistors 11 and 12 is connected to the sense amplifier control line $\overline{SAN}$ for activating the n-channel side sense amplifier 9 so as to simultaneously activate the data input/output line sense amplifier and the n-channel side sense amplifier 9.

In this case, since the sense amplifier control line $\overline{SAN}$ is precharged to 0.5.Vcc as in the pair of bit lines BL and $\overline{BL}$, the signal line $\overline{SAN}$ is dropped to Vss, and the transistors 11 and 12 are set in an OFF state until the bit line signal amplifying n-channel side sense amplifier 9 is activated. In addition, the data input/output line sense amplifier is set in a non-activation state even when the column selecting line CSL is raised in advance, and no signal appears of the pair of data input/output lines. The signal of the sense amplifier control line $\overline{SAN}$ is disabled to activate the n-channel side sense amplifier 9, and a micro potential difference between the pair of bit lines is amplified. At the same time, since the data input-/output line sense amplifier is activated to quickly generate a signal onto the pair of data input/output lines, data is transmitted to the data input/output lines at a high speed.

Figure 13:
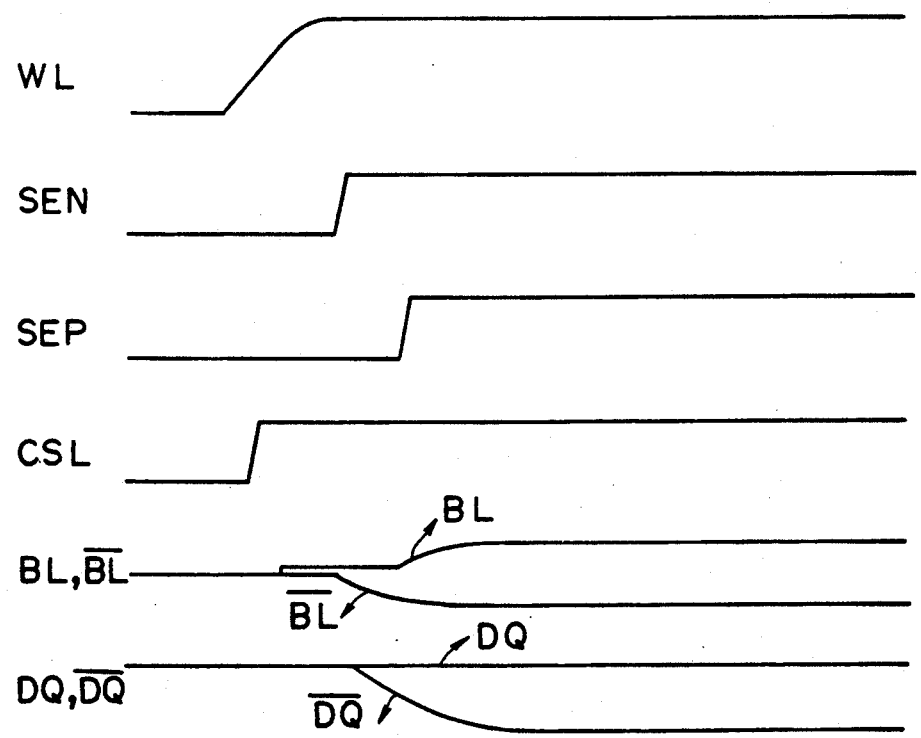
FIG. 13 is a timing chart showing an operation of the DRAM in FIG. 12.

FIG. 13 is a timing chart showing an operation of the above DRAM in FIG. 12. In this timing chart, a more preferable result than that obtained in the timing chart in FIG. 4 can be obtained. That is, in the timing chart in FIG. 13, a signal is earlier generated from the pair of data input/output lines in FIG. 13 than from the pair of data input/output lines DQ and $\overline{DQ}$ (solid line) in FIG. 4. In addition, in the timing chart in FIG. 13, the level of the "H"-level data input/output line is not decreased compared with the data input/output lines DQ and $\overline{DQ}$ (broken line).

Figure 14:
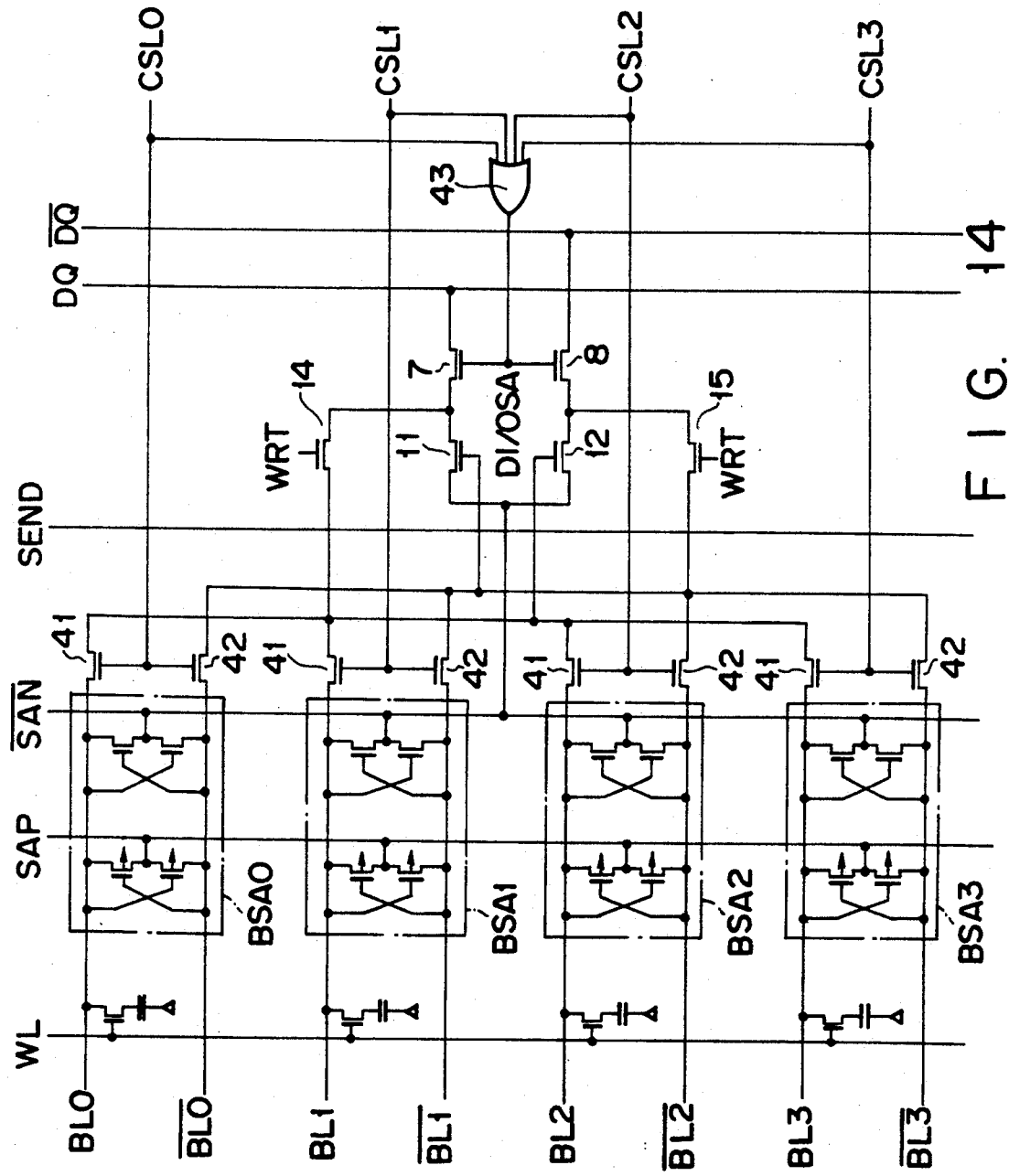
FIG. 14 is a circuit diagram showing an arrangement of a DRAM according to the tenth embodiment of the present invention.

FIG. 14 is a circuit diagram showing an arrangement of a DRAM according to the tenth embodiment of the present invention.

This embodiment is obtained by applying the arrangement in FIG. 12 to the embodiment in FIG. 11. That is, in this embodiment, one data input/output line sense amplifier DI/OSA (in this case, the transistor 13 is omitted) is arranged for each of four pairs of bit lines BL0 and $\overline{BL0}$ to BL3 and $\overline{BL3}$, and the data input/output line sense amplifier is activated in accordance with the signal of the sense amplifier control line $\overline{SAN}$. The same reference numeral as in FIG. 11 denote the same parts in FIG. 14, and a detailed description thereof will be omitted.

Figure 15:
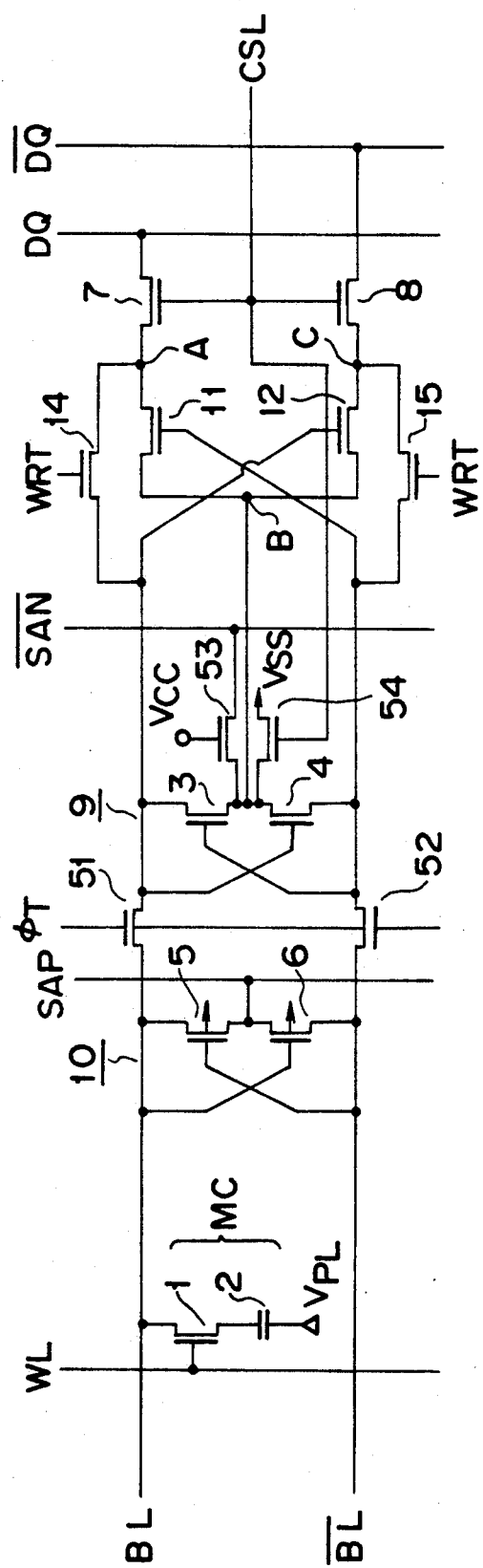
FIG. 15 is a circuit diagram showing an arrangement of a DRAM according to the eleventh embodiment of the present invention.

FIG. 15 is a circuit diagram showing an arrangement of a DRAM according to the eleventh embodiment of the present invention.

In the DRAM of this embodiment, unlike the DRAM in FIG. 12, a pair of barrier n-channel MOS transistors 51 and 52 are inserted between the n-channel side sense amplifier 9 and the p-channel side sense amplifier 10 of the bit line sense amplifier, the common node between the transistors 3 and 4 of the n-channel side sense amplifier 9 and the common node B between the transistors 11 and 12 are connected to the sense amplifier control line $\overline{SAN}$ through an n-channel MOS transistor 53, and the common node between the transistors 3 and 4 of the n-channel side sense amplifier 9 and the common node B of the transistors 11 and 12 are connected to the ground potential Vss through an n-channel MOS transistor 54. Note that the gates of the transistors 51 and 52 are connected to a control signal line $\phi_T$. A signal of the signal line $\phi_T$ is always set at a Vcc level or temporarily set at low level such as a Vss level. In addition, the power source potential Vcc is always supplied to the gate of the transistor 53, and the transistor 53 is always set in an ON state. The gate of the transistor 54 is connected to the corresponding column selecting line CSL.

When a Vcc-level signal is always supplied to the signal line $\phi_T$, the circuit is operated as if a resistor is inserted between the sense node of the n-channel side sense amplifier 9 and the pair of bit lines, and the capacitance of the sense node of the n-channel side sense amplifier 9 is temporarily decreased, thereby performing the sensing operation at a high speed. On the other hand, when the signal line is temporarily disabled to low level such as a Vss level, the transistors 51 and 52 are turned off, and the sense node of the n-channel side sense amplifier 9 and the pair of bit lines are separated from each other. Therefore, the capacitance of the sense node of the n-channel side sense amplifier 9 is decreased compared with the above-described case, thereby performing the sensing operation at a higher speed.

The transistor 53 serves as a resistor, and it causes a large number of n-channel side sense amplifiers to slowly, uniformly perform a sensing operation regardless of a column selecting state. In a specific column selected by raising the column selecting line CSL, only its n-channel side sense amplifier performs the sensing operation at a high speed.

In this embodiment, the common node B between the n-channel transistors 11 and 12 of the data input/output line sense amplifier is connected to the common node between the n-channel MOS transistors 3 and 4 of the n-channel side sense amplifier 9 of the bit line sense amplifier, and the potentials of the above nodes are decreased at a high speed in a specific column selected on the column selecting line CSL. Therefore, since a sensing operation in the data input/output line sense amplifier can be performed at a high speed, the most effective circuit arrangement can be obtained although the number of elements is increased.

FIG. 16 is a circuit diagram showing an arrangement of a DRAM according to the twelfth embodiment of the present invention.

In the DRAM of this embodiment, in place of respectively connecting the data write transistors 14 and 15 of the embodiment in FIG. 12 between the node A and the bit line BL and between the node C and the bit line $\overline{BL}$, the transistor 14 is inserted between the bit line BL and the data input/output line DQ, and the transistor 15 is inserted between the bit line $\overline{BL}$ and the data input/output line $\overline{DQ}$. The gates of the column selecting transistors 7 and 8 are connected to a column selecting line CSLR selectively driven in only a data reading operation, and the gates of the data write transistors 14 and 15 are connected to a column selecting line CSLW selectively driven in only a data writing operation.

With the above arrangement, in a data writing operation, data is transmitted from each of the pair of data input/output lines to each of the pair of bit lines through only one transistor, and a high-speed data writing operation can be easily obtained.

Figure 17:
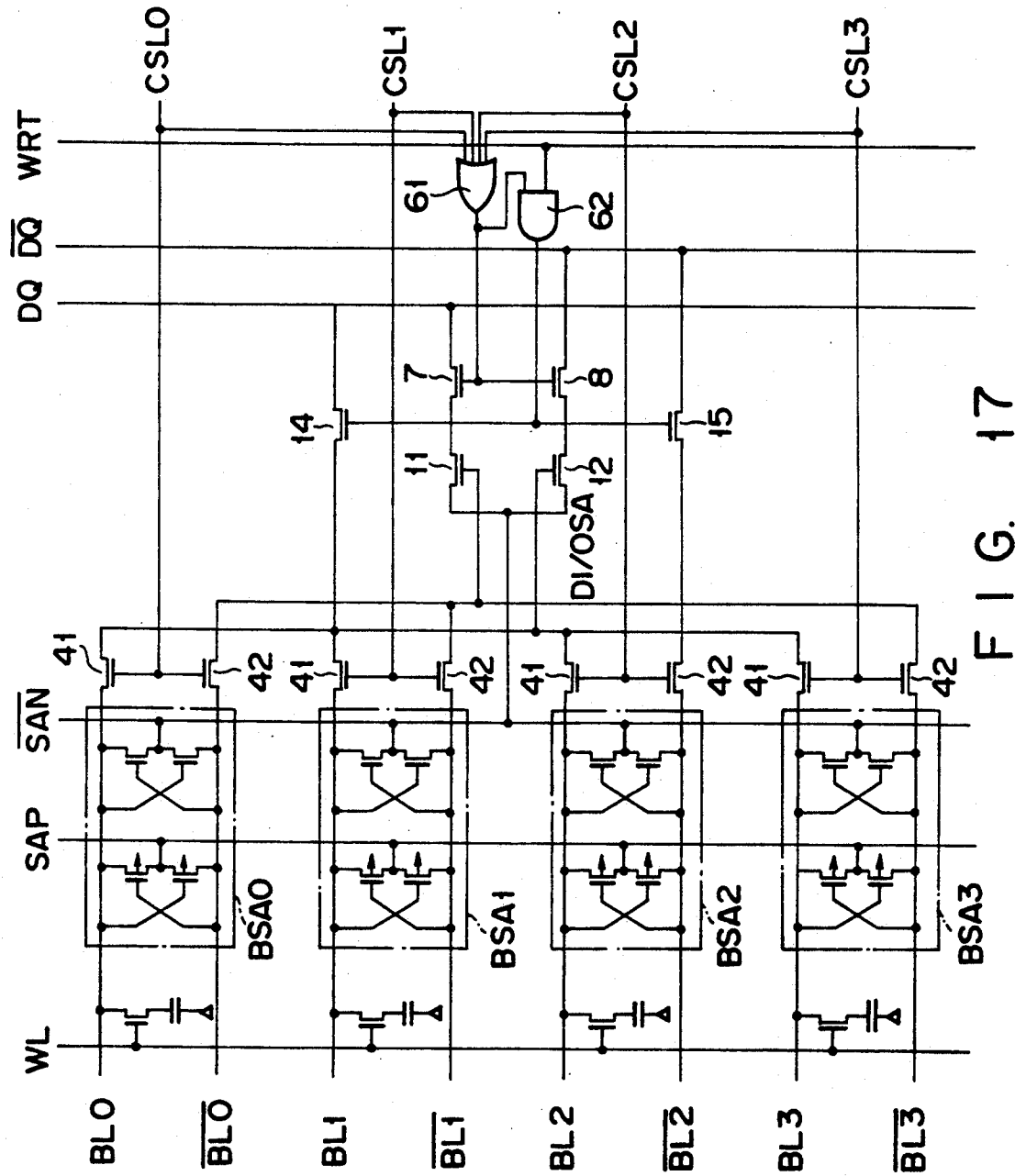
FIG. 17 is a circuit diagram showing an arrangement of a DRAM according to the thirteenth embodiment of the present invention.

FIG. 17 is a circuit diagram showing an arrangement of a DRAM according to the thirteenth embodiment of the present invention.

In the DRAM of this embodiment, one data input/output line sense amplifier is arranged for plural pairs of bit lines, as in the DRAM shown in FIG. 14, and the data write transistors 14 and 15 are inserted between the pair of bit lines BL and $\overline{BL}$ and the pair of data input/output lines DQ and $\overline{DQ}$ as shown in FIG. 16. In this case, the column selecting transistors 7 and 8 which are turned on in a data reading operation are controlled by an output from an OR gate 61 to which signals of the column selecting lines CSL0 to CSL3 are input. The data write transistors 14 and 15 which are turned on in a data writing operation are controlled by an output from the OR gate 61 and a signal from an AND gate 62 to which a signal of a data write control line WRT is input.

As in the embodiment in FIG. 14, the DRAM of this embodiment is effectively used, for example, when the area of the data input/output line sense amplifiers on a silicon chip is too large to arrange a data input/output line sense amplifier for each pair of bit lines, or when a data input/output line sense amplifier is arranged for each pair of bit lines such that a chip area is increased to exceed an allowable range.

In the embodiments in FIGS. 14 and 17, one data input/output line sense amplifier is arranged for every four pairs of bit lines. However, one data input/output line sense amplifier may be arranged in units of two, four, eight, or sixteen pairs of bit lines. In general, one data input/output sense amplifier can be arranged in units of $2^n$ (n is a natural number) pairs of bit lines.

The present invention is not limited to the above-described embodiments, and various modifications can be made. For example, in the above embodiment in FIG. 3, p-channel MOS transistors can be used as the column selecting n-channel MOS transistors 7 and 8, the data write n-channel MOS transistors 14 and 15, and the activating n-channel MOS transistor 13. Similarly, in the embodiments in FIGS. 5, 6, 7, and 8, p-channel MOS transistors can be used as the column selecting n-channel MOS transistors 7 and 8 and the data write n-channel MOS transistors 14 and 15. In addition, in the embodiments in FIGS. 7 and 8, n-channel MOS transistors are used as the driver transistors 11 and 12 of the data input/output line sense amplifiers, and p-channel MOS transistors are used as the current mirror load transistors 31 and 32. However, in this case, p-channel MOS transistors may be used as the driver transistors, and n-channel MOS transistors may be used as the current mirror load transistors.

As described above, according to the present invention, there can be provided a dynamic type semiconductor memory device in which signal transmission on a data write path from a bit line to a data input/output line is rarely delayed, thereby obtaining a high-speed operation.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A dynamic type semiconductor memory device comprising:
   a plurality of memory cells each consisting of a MOS transistor and a capacitor;
   plural pairs of bit lines each pair of which consists of first and second bit lines for supplying data to said plurality of memory cells;
   a first sense amplifier, arranged for each of said plural pairs of bit lines, for amplifying a bit line signal;
   a pair of data input/output lines, consisting of first and second data input/output lines, for extracting data from said plural pairs of bit lines;
   a second sense amplifier, arranged for each of said plural pairs of bit lines and consisting of first and second driver MOS transistors gates of which are connected to a pair of bit lines and a third activating MOS transistor rendered conductive simultaneously when or immediately after said first sense amplifier is activated, for amplifying signals of said pair of data input/output lines in a data reading operation;
   first and second column selecting transistors which are inserted between said pair of data input/output lines and said second sense amplifier and gates of which are connected to a column selecting line;
   a first write transistor one current path of which is connected to said first bit line and the other current path of which is connected to one output terminal of said second sense amplifier, said first write transistor being turned on in a data writing operation; and
   a second write transistor one current path of which is connected to said second bit line and the other current path of which is connected to the other output terminal of said second sense amplifier, said second write transistor being turned on in a data writing operation.

2. The memory device according to claim 1, wherein said first sense amplifier for amplifying a bit lin signal is a CMOS sense amplifier including a first flip-flop consisting of two n-channel MOS transistors and a second flip-flop consisting of two p-channel MOS transistors,
   said first and second driver MOS transistors of said second sense amplifier for amplifying a data input/output line signal and said third activating MOS transistor are n-channel MOS transistors,
   said first and second column selecting transistors are n-channel MOS transistors, and
   said first and second write MOS transistors are n-channel MOS transistors.

3. The memory device according to claim 1, wherein said first sense amplifier for amplifying a bit line a signal is a CMOS sense amplifier including a first flip-flop consisting of two n-channel MOS transistors and a second flip-flop consisting of two p-channel MOS transistors,
   said first and second MOS transistors of said second sense amplifier for amplifying a data input/output line signal and the third activating MOS transistor are p-channel MOS transistors,
   said first and second column selecting transistors are p-channel MOS transistors, and
   said first and second write transistors are p-channel MOS transistors 4. A dynamic type semiconductor memory device comprising:
   a plurality of memory cells each consisting of a MOS transistor and a capacitor;
   plural pairs of bit lines each pair of which consists of first and second bit lines for supplying data to said plurality of memory cells;
   a first sense amplifier, arranged for each of said plural pairs of bit lines, for amplifying a bit line signal;
   a pair of data input/output lines, consisting of first and second data input/output lines, for extracting data from said pairs of bit lines;
   a second sense amplifier, arranged for each of said plural pairs of bit lines and consisting of first and second driver LOS transistors gates of which are connected to a pair of bit lines, activated simultaneously when or immediately after said first sense amplifier is activated, for amplifying signals of said pair of data input/output lines;
   first and second column selecting transistors which are inserted between said pair of data input/output lines and said second sense amplifier and gates of which are connected to a column selecting line;
   a first write transistor one current path of which is connected to said first bit line and the other current path of which is connected to one output terminal of said second sense amplifier, said first write transistor being turned on in a data writing operation; and
   a second write transistor one current path of which is connected to said second bit line and the other current path of which is connected to the other output terminal of said second sense amplifier, said second write transistor being turned on in a data writing operation.

5. The memory device according to claim 4, wherein said first sense amplifier is a CMOS sense amplifier including a first flip-flop consisting of two n-channel MOS transistors and a second flip-flop consisting of two p-channel MOS transistors, and
   first and second driver MOS transistors of said second sense amplifier are n-channel MOS transistors sources of which are connected to each other, the common source of said n-channel MOS transistors being connected to a signal line for activating said first flip-flop.

6. The memory device according to claim 4, wherein said first sense amplifier is a CMOS sense amplifier including a first flip-flop consisting of two n-channel MOS transistors and a second flip-flop consisting of two p-channel MOS transistors, and first and second driver MOS transistors, of said second sense amplifier are p-channel MOS transistors sources of which are connected to each other, the common source of said n-channel MOS transistors being connected to a signal line for activating said second flip-flop.

7. A dynamic type semiconductor memory device comprising:

a plurality of memory cells each consisting of a MOS transistor and a capacitor;

plural pairs of bit lines each pair of which consists of first and second bit lines for supplying data to said plurality of memory cells;

a first sense amplifier, arranged for each of said plural pairs of bit lines, for amplifying a bit line signal;

a pair of data input/output lines, consisting of first and second data input/output lines, for extracting data from said plural pairs of bit lines a second sense amplifier, arranged for each of said plural pairs of bit lines and consisting of first and second driver MOS transistors gates of which are connected to a pair of bit lines, third and fourth load MOS transistors, and a fifth activating MOS transistor rendered conductive simultaneously when or immediately after said first sense amplifier is activated, for amplifying signals of said pair of data input/output lines in a data reading operation;

first and second column selecting transistor which are inserted between said pair of data input/output lines and said second sense amplifier and gates of which are connected to a column selecting line;

a first write transistor one current path of which is connected to said first bit line and the other current path of which is connected to one output terminal of said second sense amplifier, said first write transistor being turned on in a data writing operation; and a second write transistor one current path of which is connected to said second bit line and the other current path of which is connected to the other output terminal of said second sense amplifier, said second write transistor being turned on in a data writing operation.

8. The memory device according to claim 7, wherein said first sense amplifier is a CMOS sense amplifier including a first flip-flop consisting of two n-channel MOS transistors and a second flip-flop consisting of two p-channel MOS transistors, said first and second driver MOS transistors and said fifth MOS transistor of the second sense amplifier are n-channel MOS transistors, and said third and fourth MOS transistors are p-channel MOS transistors, said column selecting transistors are n-channel transistors, and said pair of write transistors are n-channel MOS transistors.

9. The memory device according to claim 7, wherein said first sense amplifier is a CMOS sense amplifier including a first flip-flop consisting of two n-channel MOS transistors and a second flip-flop consisting of two p-channel MOS transistors, said first and second driver transistors and said fifth activating MOS transistor of said second sense amplifier are p-channel MOS transistors, and said third and fourth load MOS transistors are n-channel MOS transistors, said column selecting transistors are p-channel MOS transistors, and said pair of write transistors are p-channel MOS transistors.

10. The memory device according to claim 7, wherein said first sense amplifier is a CMOS sense amplifier including a first flip-flop consisting of two n-channel MOS transistors and a second flip-flop consisting of two p-channel MOS transistors, said first and second driver MOS transistors and said fifth activating MOS transistor of said second sense amplifier are n-channel MOS transistors, and said third and fourth transistors which are p-channel MOS transistors constitute a current mirror circuit, said column selecting transistors are n-channel MOS transistors, and said pair of write transistors are n-channel MOS transistors 11. The memory device according to claim 1, wherein said first sense amplifier is a CMOS sense amplifier including a first flip-flop consisting of two n-channel MOS transistors and a second flip-flop consisting of two p-channel MOS transistors, said first and second driver MO transistors and said fifth activating MOS transistor of said second sense amplifier are n-channel MOS transistors, and said third and fourth MOS transistors which are p-channel MOS transistors constitute a current mirror circuit, said column selecting transistors are p-channel MOS transistors, and said pair of write transistors are p-channel MOS transistors.

12. The memory device according to claim 7, wherein said first sense amplifier is a CMOS sense amplifier including a first flip-flop consisting of two n-channel MOS transistors and a second flip-flop consisting of two p-channel MOS transistors, said first and second driver MOS transistors and said fifth activating MOS transistor of said second sense amplifier are p-channel MOS transistors, and said third and fourth load MOS transistors which are n-channel MOS transistors constitute a current mirror circuit, said column selecting transistors are n-channel MOS transistors, and said pair of write transistors are n-channel MOS transistors.

13. The memory device according to claim 7, wherein said first sense amplifier is a CMOS sense amplifier including a first flip-flop consisting of two n-channel MOS transistors and a second flip-flop consisting of two p-channel MOS transistors, said first and second driver MOS transistors and said fifth activating MOS transistor of said second sense amplifier are p-channel MOS transistors, said third and fourth load MOS transistors which are n-channel MOS transistors constitute a current mirror circuit, said column selecting transistors are p-channel MOS transistors, and said pair of write transistors are p-channel MOS transistors.

14. A dynamic type semiconductor memory device comprising:
- a plurality of memory cells each consisting of a MOS transistor and a capacitor;
- plural pairs of bit lines each pair of which consists of first and second bit lines for supplying data to said plurality of memory cells;
- a first sense amplifier, arranged for each of said plural pairs of bit lines, for amplifying a bit line signal;
- a pair of data input/output lines, consisting of first and second data input/output lines, for extracting data from said plural pairs of bit lines;
- a second sense amplifier, arranged for each of said plural pairs of bit lines and consisting of first and second driver MOS transistors and third and fourth MOS transistors, for amplifying a signal of said pair of data input/output lines in a data reading operation;
- a through current suppressing MOS transistor inserted between a power source terminal and a current path of one of said first and second driver MOS transistors of said second sense amplifier for amplifying a data signal;
- a gate circuit for forming an AND signal of a signal of a column selecting line and a signal for defining a timing of activating a signal of a column selecting line, said gate circuit controlling said through current suppressing transistor to be rendered conductive on the basis of the AND signal;
- first and second column selecting transistors which are inserted between said pair of data input/output lines and said second sense amplifier and gates of which are connected to a column selecting line;
- a first write transistor one current path of which is connected to said first bit line and the other current path of which is connected to one output terminal of said second sense amplifier, said first write transistor being turned on in a data writing operation; and
- a second write transistor one current path of which is connected to said second bit line and the other current path of which is connected to the other output terminal of said second sense amplifier, said second write transistor being turned on in a data writing operation.

15. A dynamic type semiconductor memory device comprising:
- a plurality of memory cells each consisting of MOS transistor and a capacitor;
- plural pairs of bit lines each pair of which consists of first and second bit lines for supplying data to said plurality of memory cells;
- a first sense amplifier, arranged for each of said plural pairs of bit lines, for amplifying a bit line signal;
- a pair of data input/output lines consisting of first and second data input/output lines for extracting data from said plural pairs of bit lines;
- a second sense amplifier, arranged for each of said plural pairs of bit lines and consisting of first and second driver MOS transistors gates of which are connected to a pair of bit lines, for amplifying a signal of said pair of data input/output lines in data reading operation;
- a column selecting line for enabling a signal from said first sense amplifier simultaneously when or immediately after said first sense amplifier is activated;
- a pair of column selecting transistors which ar inserted between said pair of data input/output lines and said second sense amplifier and gates of which are connected to said column selecting line; and
- a pair of write transistors which are inserted between said pair of data input/output lines and said pair of bit lines and turned on in a data writing operation.

16. A dynamic type semiconductor memory device comprising:
- a plurality of memory cells each consisting of a MOS transistor and a capacitor;
- plural pairs of bit lines each pair of which consists of first and second bit lines for supplying data to said plurality of memory cells;
- a first sense amplifier, arranged for each of said plural pairs of bit lines, for amplifying a bit line signal;
- a pair of data input/output lines, consisting of first and second data input/output lines, for extracting data from said pair of bit lines;
- a second sense amplifier, arranged for each of said plural pairs of bit lines and consisting of first and second driver MOS transistors gates of which are connected to a pair of bit lines, for amplifying a signal of said pair of data input/output lines simultaneously when said first sense amplifier is activated in a data reading operation,
- first and second column selecting transistors which are inserted between said pair of data input/output lines and said second sense amplifier and gates of which are connected to a column selecting line;
- a first write transistor one current path of which is connected to said first bit line and the other current path of which is connected to one output terminal of said second sense amplifier, said first write transistor being turned on in a data writing operation; and
- a second write transistor one current path of which is connected to said second bit line and the other current path of which is connected to the other output terminal of said second sense amplifier, said second write transistor being turned on in a data writing operation.

17. A dynamic type semiconductor memory device comprising: 'a plurality of memory cells each pair of which consist MOS transistor and a capacitor;
- plural pairs of bit lines each pair of which consist of first and second bit lines for supplying data to said plurality of memory cells;
- a first sense amplifier arranged for each of said pairs of bit lines, for amplifying a bit line signal;
- a pair of data input/output lines consisting of first and second data input/output lines, for extracting data from said pairs of bit lines;
- a second sense amplifier arranged for each of said plural pairs of bit lines and consisting of first and second driver MOS transistors gates of which are connected to be cross-coupled to said first and second bit lines, for extracting charges from said pair of data input/output lines in a data reading operation, and for amplifying a data input/output line signal;
- bit line pair selecting means, connected to gates of said first and second driver MOS transistors, for selecting one pair of bit lines from said plural pairs of bit lines in accordance with an address;
- first and second column selecting transistors which are inserted between said pair of data input/output lines and said second sense amplifier and gates of which are connected to a column selecting line;

a first write transistor one current path of which is connected to one input terminal of said bit line pair selecting means and the other current path of which is connected to one output terminal of said second sense amplifier, said first write transistor being turned on in a data writing operation; and a second write transistor one current path of which is connected to the other input terminal of said bit line pair selecting means and the other current path of which is connected to the other output terminal of said second sense amplifier, said second write transistor being turned on in the data writing operation.

18. A dynamic type semiconductor memory device comprising:

a plurality of memory cells each consisting of a MOS transistor and a capacitor;

plural pairs of bit lines each pair of which consist of first and second bit lines, for supplying data to said plurality of memory cells;

a first sense amplifier arranged for each of said pairs of bit lines, for amplifying a bit line signal;

a pair of data input/output lines consisting of first and second data input/output lines, for extracting data from said pairs of bit lines;

a second sense amplifier arranged for each of said plural pairs of bit lines and consisting of first and second load MOS transistors and first and second driver MOS transistors gates of which are connected to be cross-coupled to said first and second bit lines, for extracting charges from said pair of data input/output lines in a data reading operation, and for amplifying a data input/output line signal;

bit line pair selecting means, connected to gates of said first and second driver MOS transistors, for selecting one pair of bit lines from said plural pairs of bit lines in accordance with an address;

first and second column selecting transistors which are inserted between said pair of data input/output lines and said second sense amplifier and gates of which are connected to a column selecting line;

a first write transistor one current path of which is connected to one input terminal of said bit line pair selecting means and the other current path of which is connected to one output terminal of said second sense amplifier, said first write transistor being turned on in a data writing operation; and a second write transistor one current path of which is connected to the other input terminal of said bit line pair selecting means and the other current path of which is connected to the other output terminal of said second sense amplifier, said second write transistor being turned on in the data writing operation.

19. A dynamic type semiconductor memory device comprising:

a plurality of memory cells each consisting of a MOS transistor and a capacitor;

plural pairs of bit lines each pair of which consist of first and second bit lines, for supplying data to said plurality of memory cells;

a first sense amplifier arranged for each of said pairs of bit lines, for amplifying a bit line signal;

a pair of data input/output lines consisting of first and second data input/output lines, for extracting data from said pairs of bit lines;

a second sense amplifier arranged for each of said plural pairs of bit lines and consisting of first and second load MOS transistors and first and second driver MOS transistors gates of which are connected to be cross-coupled to said first and second bit lines, for extracting charges from said pair of data input/output lines in a data reading operation, and for amplifying a data input/output line signal;

bit line pair selecting means, connected to gates of said first and second driver MOS transistors, for selecting one pair of bit lines from said plural pairs of bit lines in accordance with an address;

a through current suppression MOS transistor arranged between one current path of said first and second driver MOS transistors of said second sense amplifier for amplifying a data signal and a power source terminal;

first and second column selecting transistors which are inserted between said pair of data input/output lines and said second sense amplifier and gates of which are connected to a column selecting line;

a first write transistor one current path of which is connected to one input terminal of said bit line pair selecting means and the other current path of which is connected to one output terminal of said second sense amplifier, said first write transistor being turned on in a data writing operation; and a second write transistor one current path of which is connected to the other terminal of said bit line pair selecting means and the other current path of which is connected to the other output terminal of said second sense amplifier, said second write transistor being turned on in the data writing operation.

* * * * *